United States Patent [19]
Dasgupta

[11] Patent Number: 5,900,783
[45] Date of Patent: May 4, 1999

[54] LOW VOLTAGE CLASS AB OUTPUT STAGE CMOS OPERATIONAL AMPLIFIERS

[75] Inventor: Uday Dasgupta, Singapore, Singapore

[73] Assignee: Tritech Microelectronics, Ltd., Singapore, Singapore

[21] Appl. No.: 08/905,630

[22] Filed: Aug. 4, 1997

[51] Int. Cl.[6] .............................. H03F 3/26; H03F 3/16
[52] U.S. Cl. ........................................ 330/264; 330/255
[58] Field of Search ..................................... 330/255, 264, 330/267, 292

[56] References Cited

U.S. PATENT DOCUMENTS

| | | | |
|---|---|---|---|
| 4,912,425 | 3/1990 | Kobayashi et al. | 330/264 X |
| 5,057,789 | 10/1991 | Nagaraj | 330/264 |
| 5,293,136 | 3/1994 | Ryat | 330/258 |
| 5,442,320 | 8/1995 | Kunst et al. | 330/267 |
| 5,546,045 | 8/1996 | Sauer | 327/561 |
| 5,568,090 | 10/1996 | Pierret | 330/255 |

*Primary Examiner*—Steven J. Mottol
*Attorney, Agent, or Firm*—George O. Saile; Stephen B. Ackerman

[57] ABSTRACT

A circuit is disclosed for a complimentary metal oxide semiconductor (CMOS) operational amplifier output stage which can be connected easily to almost any input stage design and which can be coupled directly to that input stage. The circuit uses nine small transistors and two output transistors. The output transistors are connected in series between the power supply rails and the size of the two output transistors determines the current available to the load. The circuit of the invention can provide rail-to-rail output voltage swings and can drive a low ohm resistive load.

17 Claims, 4 Drawing Sheets

FIG. 1 – Prior Art

LOW VOLTAGE CLASS AB OUTPUT STAGE CMOS OPERATIONAL AMPLIFIERS

BACKGROUND OF THE INVENTION

1. Field of the Invention

The invention relates to an operational amplifier circuit and, more particularly, to a complimentary metal oxide semiconductor (CMOS) operational amplifier output stage which can be connected to almost any type of input stage design.

2. Description of the Related Art

Bipolar devices for operational amplifier output stages do not yield good characteristics in sub-micron dimensions; the current gain is low resulting in an input impedance that is not high enough and the base current is significant, thus loading the output of the first stage of an operational amplifier. An operational amplifier output stage using purely CMOS devices which overcomes several problems is the better approach.

An example of the prior art is shown in FIG. 1 and is discussed in U.S. Pat. No. 5,442,320 (Kunst et al.) as FIG. 1 Prior Art. The patent discloses a Class AB output stage using bipolar transistors providing a large swing and rail-to-rail output drive. FIG. 1 of this patent is a prior art schematic circuit diagram of an operational amplifier output stage and illustrates a two current source design. Problems that this design has, and which become more severe as device dimensions shrink, is that the base current of transistor 122 loads the output of the first stage. In addition to this, the circuit is biased with two independent current sources 150 and 152. These two current sources have to match very well in order to have a low input offset voltage.

U.S. Pat. No. 5,293,136 (Ryat) discloses both bipolar and MOS embodiments of a 2-stage rail-to-rail operational amplifier that requires an RC network for both output transistors and where the output of the first stage is not directly coupled to an output transistor of the output stage.

U.S. Pat. No. 5,546,045 (Sauer) describes a rail-to-rail Class AB operational amplifier output stage that has only bipolar implementation, differs in circuit detail and requires frequency compensation.

U.S. Pat. No. 5,568,090 (Pierret) discloses an operational amplifier output stage which is oriented to increasing the output drive current by sensing that current and adjusting a bias current. Only a bipolar implementation is described.

SUMMARY OF THE INVENTION

It is an object of the present invention to provide a circuit for a class AB output stage for a complimentary metal oxide semiconductor (CMOS) operational amplifier, which can easily be operated with almost any type of input stage design and which can be coupled directly to that input stage.

Another object of the present invention is to provide a CMOS operational amplifier which can have wide range of output voltage swings approaching the upper and lower supply rail voltages and which can drive low ohm resistive loads.

These objects have been achieved by a circuit which consists of a level shifter, a current mirror with a single fixed current source, and an output driver circuit, where the level shifter and the current mirror use only nine small transistors, and where the size of the two complimentary transistors of the output driver circuit determines the output current to the load.

DESCRIPTION OF THE PREFERRED EMBODIMENT

Figure 1:
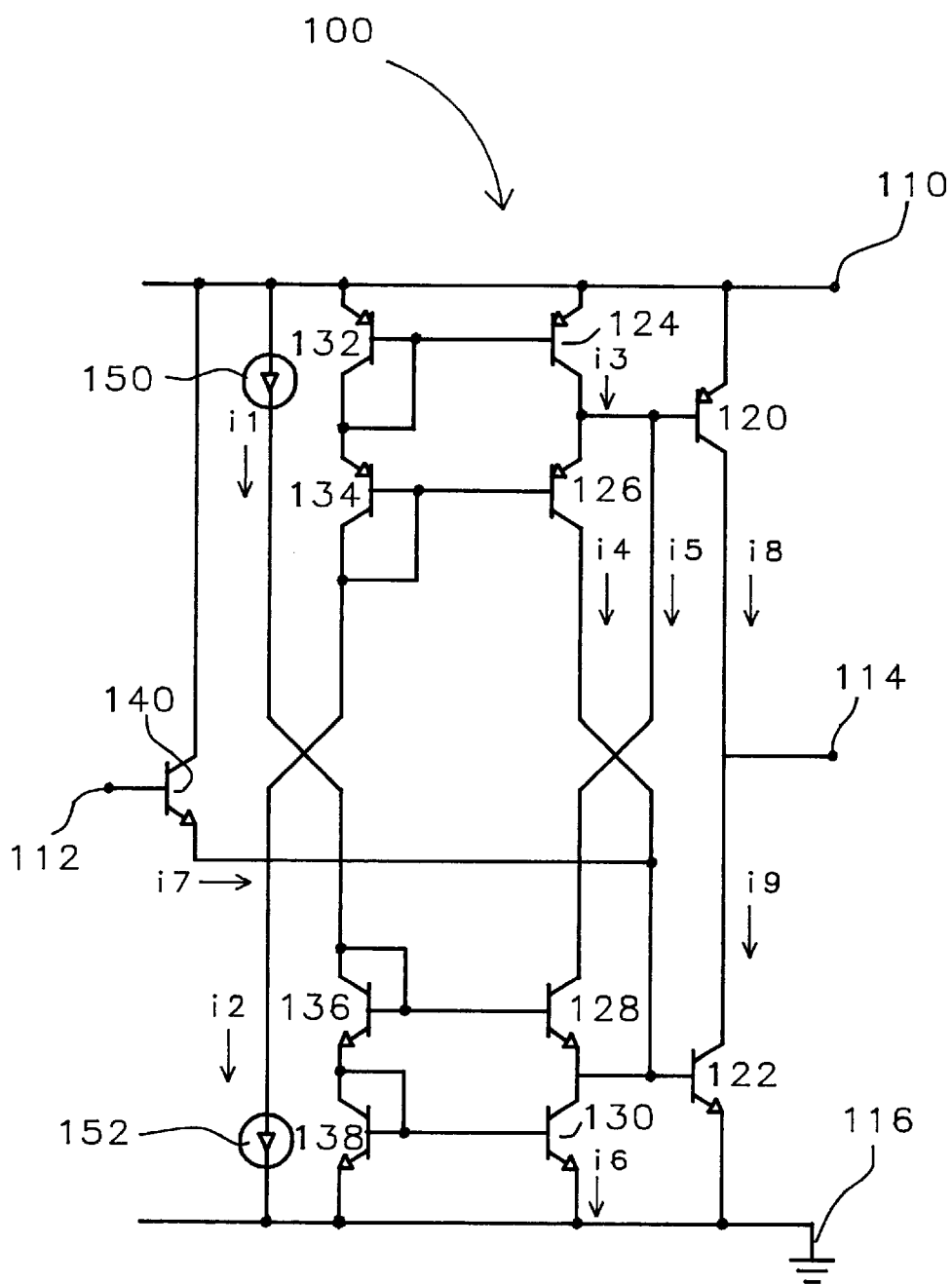
FIG. 1 is a circuit diagram of prior art depicting an operational amplifier output stage using bipolar transistors.
Figure 2:
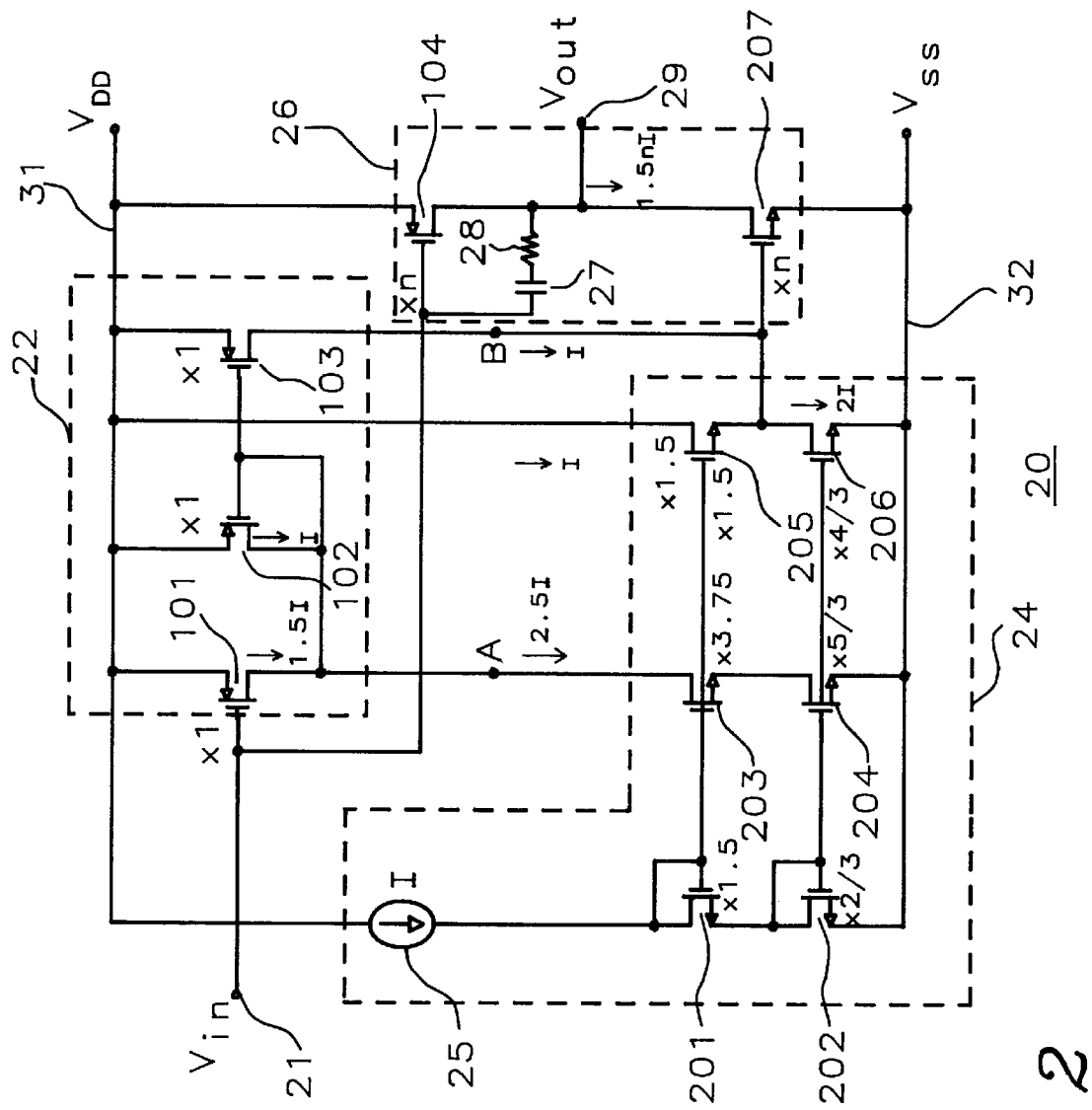
FIG. 2 is a circuit diagram of the present invention depicting a CMOS operational amplifier output stage.

Referring now to FIG. 2, we show a circuit of the present invention. A complimentary metal oxide semiconductor (CMOS) operational amplifier output stage 20 consisting of a level shifter 22, a current mirror 24, and an output driver circuit 26. The function of the level shifter is to provide input 21 ($V_{in}$) with unity gain and zero phase shift to the gate of output transistor 207 of the output driver circuit. The function of the current mirror is to provide a quiescent current for the same output transistor. Input 21 ($V_{in}$) is the output of a first stage operational amplifier circuit and is the input for the level shifter and the output driver circuit 26. Output driver circuit 26 amplifies the input signal and provides an output signal for the load at output 29 ($V_{out}$).

The CMOS operational amplifier output stage 20 is connected to a supply voltage $V_{DD}$ via a positive rail 31 and to a reference potential $V_{SS}$ via a negative rail 32. The level shifter 22 consists of three p-channel transistors 101 to 103, of unit size 1, each having a source-drain path and a gate. In addition, transistors 205 and 102 act as loads for transistors 103 and 101 respectively. P-channel transistors 101 and 102 are connected between the positive rail 31 and Terminal A of the level shifter. The gate of transistor 101 is connected to input 21. The gates of transistors 102 and 103 are connected to Terminal A. Transistor 103 is connected between voltage rail 31 and Terminal B. Transistors 101 to 103 act as level shifters for output transistor 207; in addition transistor 102 is a current source for current mirror transistor 103.

Current mirror 24 consists of a fixed current source 25 and six n-channel transistors 201 to 206 with unit sizes of 1.5, 2/3, 3.75, 5/3, 1.5, and 4/3 respectively. Transistor 201 acts as a current source for current mirror transistors 203 and 205, and transistor 202 acts as a current source for current mirror transistors 204 and 206. Transistors 203, 204, and 206 help improve the large signal behavior of level shifter 22. The quiescent current at Terminal B is determined by transistors 201, 205, 202, and 206 with the help of fixed current source 25. N-channel transistors 201 and 202 are connected in series between one terminal of fixed current source 25 and the negative rail 32, while the other terminal of fixed current source 25 is connected to the positive rail 31. Transistors 203 and 204 are connected in series between Terminal A and the negative rail, and transistors 205 and 206 are connected serially between the positive and negative rails. As mentioned earlier, n-channel transistor 205 is a current mirror of n-channel transistor 201 and is the load for p-channel transistor 103. The level shifter has a very wide bandwidth and, therefore, does not affect the frequency compensation of the operational amplifier. The bandwidth is typically 30 MHz, but may range from 20 to 50 MHz.

Output driver circuit 26 comprises p-channel output transistor 104, connected between the positive rail 31 and output 29 ($V_{out}$), and n-channel output transistor 207, connected between output 29 and the negative rail 32. The gate of output transistor 104 is connected to input 21 of the operational amplifier output stage, and the gate of output transistor 207 is connected to Terminal B, an output of level shifter 22.

Input 21 can be connected directly to the output of an operational amplifier input stage, see FIG. 2. The gate of transistor 104 is, therefore, getting its direct current bias directly from the output terminal of the preceding operational amplifier input stage.

Transistors 104 and 207 have the same multiple 'n' of the basic unit size. 'n' is determined by the current required to drive the load at output 29. To carry the same current the unit size of a p-channel transistor must be approximately 3 times that of a n-channel transistor; if the basic unit size of a p-channel transistor is 30 micron wide and 3 micron long, the basic unit size of an equivalent n-channel transistor is 10 micron wide and 3 micron long. The current through a current mirror is determined by the unit size ratio of current mirror/current source. Transistors 203 and 204 thus conduct 2.5 times the current I that flows through fixed current source 25 and transistors 201 and 202. Similarly, transistor 206 conducts the current 2I.

Since $V_{GS}$ of transistor 201 and transistor 205 are the same, $V_{DS}$ of transistor 206, or $V_{GS}$ of transistor 207, is equal to the $V_{GS}$ of transistor 202. In other words, the current in output transistor 207 is related to the current in transistor 202 (which is I) by the size ratio of output transistor 207 to transistor 202, which works out to be 1.5nI. All other currents are also related to current I. There is no conflict between output transistor 104 and output transistor 207, since the current of output transistor 104 is not forced. The small signal $V_{in}$ is transmitted with equal gain and in-phase to output transistors 104 and 207. The load current that output stage 26 can handle depends on the physical dimensions of output transistors 104 and 207, while the quiescent current of output stage 26 is set by n-channel transistor 207 in relation with the current I of fixed current source 25.

The current through transistor 101 is determined by the ratio of its size to that of transistor 104 and the current carried by the latter since the gate source voltages of the two transistors are equal. So it turns out that transistor 101 carries a current of 1.5I. So the rest of the 2.5I that flows out of terminal A flows into transistor 102 which, therefore, carries a current I. Transistor 103, being a mirror transistor to 102 of the same size, also carries a current I. Since the sum of the currents in transistors 103 and 205 is equal to the current in transistor 206, which carries a current of 2I, transistor 205 also carries a current I.

Figure 3:
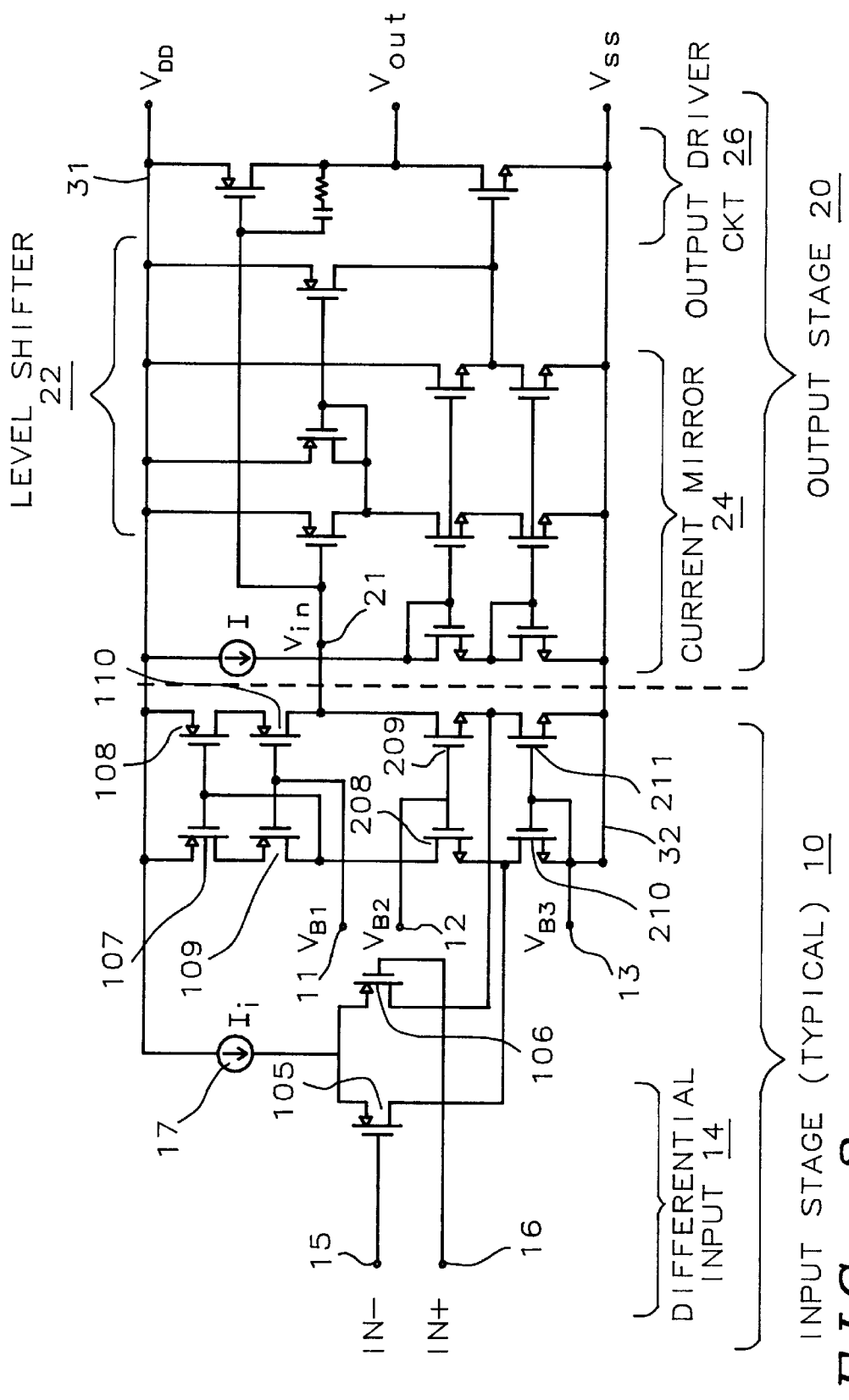
FIG. 3 is a circuit diagram depicting a CMOS operational amplifier input stage connected to the operational amplifier output stage of FIG. 2.

Still referring to FIG. 2, transistors 203, 204, and 206 help improve the large signal behavior of level shifter 22. When $V_{in}$ moves towards $V_{DD}$ just enough to switch off transistor 101, the entire current from transistor 203 flows into transistor 102 and is mirrored in transistor 103. Since now the current in transistor 103 (equal to 2.5I) is larger than the current in transistor 206 (equal to 2I), transistor 103 is able to pull the gate of transistor 207 all the way to $V_{DD}$ by switching off transistor 205. $V_{in}$, as well as the gate of transistor 104, can also have an excursion down to $V_{SS}$ with the operational amplifier input stage 10 as shown in FIG. 3. Thus the output stage is capable of driving very heavy currents into the load under large signal conditions.

An operational amplifier using this output stage 20 can be compensated, if desired, with a Miller compensation scheme using capacitor 27 and resistor 28 connected between input 21 and output 29.

Referring now to FIG. 3, we show an implementation of a CMOS operational amplifier input stage 10 connected to the operational amplifier output stage 20 of the present invention. P-channel transistors 107 and 109 and n-channel transistors 208 and 210 are connected in series between positive rail 31 ($V_{DD}$) and negative rail 32 ($V_{SS}$). P-channel transistors 108 and 110 and n-channel transistors 209 and 211 are connected in similar fashion between the two supply rails 31 and 32. The drain of transistor 109 connects to the gates of transistors 107 and 108. Bias Input 11 ($V_{B1}$) connects to the gates of transistors 109 and 110, Bias Input 12 ($V_{B2}$) connects to the gates of transistors 208 and 209, and Bias Input 13 ($V_{B3}$) connects to the gates of transistors 210 and 211.

Differential input 14 consists of p-channel transistors 105 and 106. Input 15 (IN−) is connected to the gate of p-channel transistor 105 and Input 16 (IN+) is connected to the gate of p-channel transistor 106. Current Source 17 is connected on one side to positive rail 31, and on the other side to the source of transistors 105 and 106. The drain of transistor 105 is connected to the source of transistor 208, and the drain of transistor 106 is connected to the source of transistor 209. The drain junction of transistors 110 and 209 is the output of operational amplifier input stage 10 and feeds input 21 of the operational amplifier output stage 20.

Input 21 ($V_{in}$) can swing close to $V_{SS}$ (rail 32) during large signal conditions because inputs 12 ($V_{B2}$) and 13 ($V_{B3}$) are biased as a high-swing cascode. This ensures an output swing almost up to the positive rail while driving heavy loads. The output swing down to the negative rail requires a small positive swing at input 21 ($V_{in}$) as explained earlier.

Figure 4:
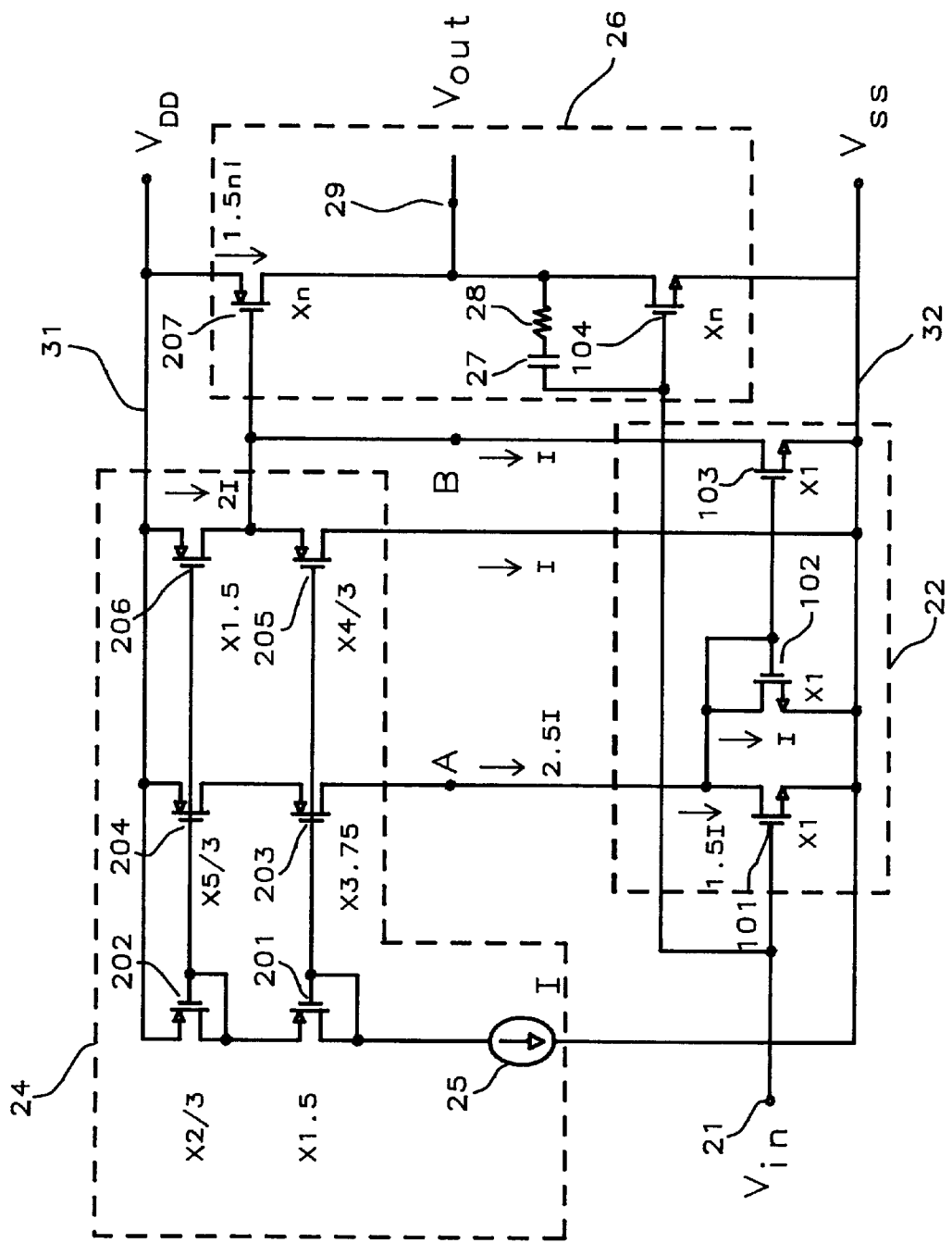
FIG. 4 is a circuit diagram which is a mirror image of the circuit diagram of FIG. 2.

Referring now to FIG. 4, we show a circuit similar to FIG. 3, except that the circuit is mirrored around the axis of rail 31, the top rail staying the positive rail supplied by $V_{DD}$.

Advantages of the operational amplifier output stage of the present invention are that it is easy to integrate with almost any type of input stage design, the design is suitable for a three volt supply between $V_{DD}$ and $V_{SS}$, a simple compensation scheme consisting of a capacitor 27 and a resistor 28 between input and output of the operational amplifier output stage, use of only nine small transistors (excluding the two output transistors), choice of output transistor size, capability to drive low value resistive loads in the range of 20 to 40 ohms, in addition to loads with infinite resistance, and the ability of the circuit to deliver an output voltage that can swing from rail-to-rail. Another advantages are a very stable quiescent current and low input offset voltages. This is because all the quiescent currents are determined from a single current source.

While the invention has been particularly shown and described with reference to the preferred embodiments thereof, it will be understood by those skilled in the art that various changes in form and details may be made without departing from the spirit and scope of the invention.

What is claimed is:

1. A complimentary metal oxide semiconductor (CMOS) operational amplifier output stage, comprising:

an input with a input voltage signal applied;

an output providing an output voltage signal;

a supply voltage connected to a positive voltage rail of said operational amplifier output stage;

a reference potential connected to a negative voltage rail of said operational amplifier output stage;

a level shifter connected to said input, with a first output and a second output, said level shifter providing unity gain for a n-channel CMOS output transistor, said level shifter further comprising:

a first p-channel transistor having a source-drain path and a gate, said source-drain of said first p-channel transistor connected between said positive voltage rail and said first output of said level shifter, said gate of said first p-channel transistor connected to said input of said operational amplifier output stage, a second p-channel transistor having a source-drain path and a gate, said source-drain of said second p-channel transistor connected between said positive voltage rail and said first output of said level shifter, said gate of said second p-channel transistor connected to said first output of said level shifter, and a third p-channel transistor having a source-drain path and a gate, said source-drain of said third p-channel transistor connected between said positive voltage rail and said second output of said level shifter, and said gate of said third p-channel transistor connected to said first output of said level shifter;

a current mirror, providing a quiescent current for said n-channel CMOS output transistor, said current mirror further comprising:

a first n-channel transistor having a drain-source path and a gate, said drain and gate of said first n-channel transistor connected to said positive voltage rail, a second n-channel transistor having a drain-source path and a gate, said drain and gate of said second n-channel transistor connected to said source of said first n-channel transistor, said source of said second n-channel transistor connected to said negative voltage rail, a third n-channel transistor having a drain-source path and a gate, said drain of said third n-channel transistor connected to said first output of said level shifter, said gate of said third n-channel transistor connected to said positive voltage rail, a fourth n-channel transistor having a drain-source path and a gate, said drain-source of said fourth n-channel transistor connected between said source of said third n-channel transistor and said negative voltage rail, said gate of said fourth n-channel transistor connected to said source of said first n-channel transistor, a fifth n-channel transistor having a drain-source path and a gate, said drain-source of said fifth n-channel transistor connected between said positive voltage rail and said second output of said level shifter, said gate of said fifth n-channel transistor connected to said positive voltage rail, a sixth n-channel transistor having a drain-source path o and a gate, said drain-source of said sixth n-channel transistor connected between said second output of said level shifter and said negative voltage rail, said gate of said sixth n-channel transistor connected to said source of said first n-channel transistor; and an output driver circuit having an input and an output, said input and said output of said output driver circuit connected to said input and said output of said operational amplifier output stage, respectively, said output driver circuit providing said amplified output voltage signal of said input voltage signal, said output driver circuit further comprising:

a p-channel CMOS output transistor having a source-drain path and a gate, said source-drain of said p-channel CMOS output transistor connected between said positive voltage rail and said output of said output driver stage, said gate of said p-channel CMOS output transistor connected to said input of said output driver stage, and said n-channel CMOS output transistor having a drain-source path and a gate, said drain-source of said n-channel CMOS output transistor connected between said output of said output driver stage and said negative voltage rail, and said gate of said n-channel CMOS output transistor connected to said second output of said level shifter.

2. The operational amplifier output stage of claim 1, wherein said input of said operational amplifier output stage can be connected directly to an output terminal of an operational amplifier input stage.

3. The operational amplifier output stage of claim 1, wherein said gate of said p-channel CMOS output transistor is getting its direct current bias directly from an output terminal of an operational amplifier input stage.

4. The operational amplifier output stage of claim 1, wherein the current through said n-channel CMOS output transistor is related to the current through said second n-channel transistor of said current mirror by the size ratio of said n-channel CMOS output transistor to said second n-channel transistor of said current mirror.

5. The operational amplifier output stage of claim 1, wherein there is no conflict between said p-channel CMOS output transistor and said n-channel CMOS output transistor, since the current of said p-channel CMOS output transistor is not forced.

6. The operational amplifier output stage of claim 1, wherein said input voltage signal is transmitted with equal gain to said CMOS output transistors.

7. The operational amplifier output stage of claim 1, wherein said input voltage signal is transmitted in-phase to said CMOS output transistors.

8. The operational amplifier output stage of claim 1, wherein said output driver circuit further comprises a capacitor and a resistor connected in series between said input of said operational amplifier output stage and said output of said operational amplifier output stage.

9. The operational amplifier output stage of claim 1, wherein said output voltage at said output of said operational amplifier output stage swings close to said voltage rails.

10. The operational amplifier output stage of claim 1, wherein said CMOS output transistors have a unit size.

11. The CMOS output transistors of claim 10, wherein said CMOS output transistors have said same unit size.

12. The CMOS output transistors of claim 10, wherein said unit size is a multiple of a basic unit size.

13. The CMOS output transistors of claim 10, wherein said unit size of said CMOS transistors determines a load current produced by said output driver circuit.

14. The operational amplifier output stage of claim 1, wherein said CMOS output transistors can drive a load at said output in the range from infinity to 20 ohms.

15. The operational amplifier output stage of claim 1, wherein said level shifter has a bandwidth ranging from 20 MHz to 50 MHz.

16. The operational amplifier output stage of claim 1, wherein said operational amplifier output stage functions equally well when mirrored around said positive voltage rail, such that said positive voltage rail becomes a negative voltage rail prime, said negative voltage rail becomes a positive voltage rail prime, said level shifter is connected to said negative voltage rail prime, said current mirror is connected to said positive voltage rail prime, all p-channel transistors become n-channel transistors and all n-channel transistors become p-channel transistors.

17. The operational amplifier output stage of claim 1, wherein a quiescent current of said output stage is set by said n-channel CMOS output transistor in relation to a fixed current source, said current source represented by said first and said second n-channel transistor of said current mirror.

* * * * *

UNITED STATES PATENT AND TRADEMARK OFFICE
CERTIFICATE OF CORRECTION

PATENT NO. : 5,900,783
DATED : May 4, 1999
INVENTOR(S) : Uday Dasgupta

It is certified that error appears in the above-identified patent and that said Letters Patent is hereby corrected as shown below:

On the title page, in Item [54], title should read -- LOW VOLTAGE CLASS AB OUTPUT STAGE FOR CMOS OPERATIONAL AMPLIFIERS--.

Signed and Sealed this

Third Day of August, 1999

*Attest:*

Q. TODD DICKINSON

*Attesting Officer*   *Acting Commissioner of Patents and Trademarks*